US012716918B2

(12) United States Patent
Latham et al.

(10) Patent No.: US 12,716,918 B2
(45) Date of Patent: Aug. 25, 2026

(54) CURRENT SENSOR BUILT INTO SWITCHES

(71) Applicant: Allegro MicroSystems, LLC, Manchester, NH (US)

(72) Inventors: Alexander Latham, Harvard, MA (US); Paul A. David, Bow, NH (US); Vijay Mangtani, Nashua, NH (US); Michael C. Doogue, Bedford, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 154 days.

(21) Appl. No.: 18/818,749

(22) Filed: Aug. 29, 2024

(65) Prior Publication Data

US 2026/0063680 A1 Mar. 5, 2026

(51) Int. Cl.
*G01R 19/00* (2006.01)
*G01R 15/20* (2006.01)

(52) U.S. Cl.
CPC .................................. *G01R 15/207* (2013.01)

(58) Field of Classification Search
CPC .................................................... G01R 15/207
See application file for complete search history.

(56) References Cited

U.S. PATENT DOCUMENTS 7,551,028 B1 6/2009 Cyrusian
7,936,144 B2 5/2011 Vig et al.
8,084,969 B2 12/2011 David et al.
8,138,708 B2 3/2012 Ward et al.
8,461,782 B2 6/2013 Ward et al.
8,629,642 B2 1/2014 Ward et al.
8,716,959 B2 5/2014 David et al.
(Continued)

FOREIGN PATENT DOCUMENTS

CN 111562418 W 8/2020
DE 10 2016 104285 A1 9/2016
(Continued)

OTHER PUBLICATIONS

U.S. Appl. No. 18/609,396, filed Mar. 19, 2024, Romero.
(Continued)

*Primary Examiner* — Alesa Allgood
(74) *Attorney, Agent, or Firm* — DALY, CROWLEY, MOFFORD & DURKEE, LLP

(57) ABSTRACT

An apparatus, comprising: a substrate; a switching device that is formed over the substrate, the switching device including a gate layer, a source layer, and a drain layer; a first layer of dielectric material that is formed over the switching device; a first contact member that is electrically coupled to one of the gate layer, the source layer, and the drain layer, the first contact member being formed of at least one electrically-conductive material, the first contact member extending through the first layer of dielectric material; a plurality of first magnetic field sensing elements, the plurality of first magnetic field sensing elements being arranged to at least partially surround the first contact member, the plurality of first magnetic field sensing elements being arranged, at least in part, to form a sensing circuit for measuring a level of electrical current through the first contact member.

31 Claims, 11 Drawing Sheets

(56) References Cited

U.S. PATENT DOCUMENTS 8,736,316 B2 5/2014 Chaware et al.
8,873,944 B2 10/2014 Latham et al.
9,042,716 B2 5/2015 Cadugan et al.
9,322,887 B1 4/2016 Eagen et al.
9,354,284 B2 5/2016 Latham
9,470,765 B1 10/2016 Latham
9,529,060 B2 12/2016 Fermon et al.
9,537,383 B1 1/2017 Wibben
9,605,975 B2 3/2017 Foletto et al.
9,605,979 B2 3/2017 Eagen et al.
9,625,535 B2 4/2017 Cadugan et al.
9,719,806 B2 8/2017 Foletto et al.
9,720,054 B2 8/2017 Drouin et al.
9,784,594 B2 10/2017 David et al.
9,804,234 B2 10/2017 Dressler et al.
9,812,637 B2 11/2017 Fermon et al.
9,823,090 B2 11/2017 Foletto et al.
9,823,092 B2 11/2017 David et al.
9,880,026 B1 1/2018 Eagen et al.
9,910,087 B2 3/2018 Eagen et al.
10,036,785 B2 7/2018 David et al.
10,041,810 B2 8/2018 Vig et al.
10,209,803 B2 2/2019 Kim et al.
10,290,608 B2 5/2019 Latham et al.
10,310,028 B2 6/2019 Latham et al.
10,347,277 B2 7/2019 Campiglio et al.
10,386,169 B2 8/2019 Hirota et al.
10,509,058 B2 12/2019 Cadugan et al.
10,557,725 B2 2/2020 Paul et al.
10,585,152 B2 3/2020 David et al.
10,670,669 B2 6/2020 Lassalle-Balier et al.
10,690,731 B2 6/2020 Foletto et al.
10,746,820 B2 8/2020 Lassalle-Balier et al.
10,794,936 B2 10/2020 Romero
10,823,586 B2 11/2020 Eagen et al.
10,837,753 B2 11/2020 Lassalle-Balier et al.
10,852,161 B2 12/2020 Cesaretti et al.
10,948,555 B2 3/2021 Tran et al.
10,976,183 B2 4/2021 David et al.
11,175,359 B2 11/2021 Lassalle-Balier et al.
11,199,424 B2 12/2021 Lassalle-Balier et al.
11,215,681 B2 1/2022 David et al.
11,307,017 B2 4/2022 Romero
11,327,127 B2 5/2022 Lassalle-Balier et al.
11,408,948 B2 8/2022 Lassalle-Balier
11,467,233 B2 10/2022 Lassalle-Balier et al.
11,525,875 B2 12/2022 Lassalle-Balier et al.
11,604,058 B2 3/2023 Lassalle-Balier et al.
2002/0191451 A1 12/2002 Kishi et al.
2005/0128654 A1 6/2005 Sapozhnikov
2006/0267581 A1 11/2006 Wiese
2007/0228500 A1 10/2007 Shimazu et al.
2007/0296391 A1 12/2007 Bertin et al.
2008/0084205 A1 4/2008 Zimmer et al.
2009/0189601 A1 7/2009 Okada et al.
2010/0073827 A1 3/2010 Zhao et al.
2010/0271013 A1 10/2010 Servel et al.
2010/0301845 A1 12/2010 Acker
2011/0037459 A1 2/2011 Okada et al.
2011/0285395 A1 11/2011 van Veldhoven et al.
2012/0038348 A1 2/2012 Aimuta et al.
2012/0095712 A1 4/2012 Komasaki et al.
2012/0119729 A1 5/2012 Komasaki et al.
2013/0113478 A1 5/2013 Pant
2013/0335070 A1 12/2013 Abe et al.
2014/0028307 A1 1/2014 Ausserlechner
2014/0225605 A1 8/2014 Lei et al.
2014/0225649 A1 8/2014 Yoshikawa
2015/0192432 A1 7/2015 Noguchi et al.
2016/0169707 A1 6/2016 Hirota et al.
2016/0313412 A1 10/2016 Li et al.
2017/0322052 A1 11/2017 Paul et al.
2017/0343608 A1* 11/2017 Keser ................. G01R 19/0084
2018/0113179 A1 4/2018 Deak et al.
2018/0224300 A1 8/2018 Vig et al.
2018/0234093 A1 8/2018 Mauder et al.
2018/0335484 A1 11/2018 Campiglio et al.
2018/0335486 A1 11/2018 Lassalle-Balier et al.
2019/0158084 A1 5/2019 Rossler et al.
2019/0219643 A1 7/2019 Cadugan et al.
2019/0234764 A1 8/2019 Lassalle-Balier
2019/0383646 A1 12/2019 Lassalle-Balier et al.
2020/0018780 A1 1/2020 Cadugan et al.
2020/0033424 A1 1/2020 Campiglio et al.
2020/0041310 A1 2/2020 Lassalle-Balier et al.
2020/0041583 A1 2/2020 Cadugan et al.
2020/0041584 A1 2/2020 Lassalle-Balier et al.
2020/0064413 A1 2/2020 Campiglio et al.
2020/0066790 A1 2/2020 Lassalle-Balier et al.
2020/0166381 A1 5/2020 Mochizuki
2020/0379064 A1 12/2020 Yuan
2021/0063501 A1 3/2021 Lassalle-Balier et al.
2022/0043082 A1 2/2022 Lassalle-Balier et al.
2022/0108949 A1* 4/2022 Wang ................. G01R 33/0047
2023/0223472 A1 7/2023 Mauder et al.

FOREIGN PATENT DOCUMENTS

DE 10 2015 218 855 A1 3/2017
DE 10 2018 113821 A1 12/2018
EP 2 674 728 A2 12/2013
JP 2011-158488 8/2011
JP 2014-071039 A 4/2014
WO WO 2019/152112 A1 8/2019
WO WO 2021/040797 A1 3/2021

OTHER PUBLICATIONS

Jaffrés et al., "Angular Dependence of the Tunnel Magnetoresistance in Transition-Metal-Based Junctions;" Physical Review B, vol. 64, 064427; Jul. 2001; 7 Pages.
U.S. Non-Final Office Action dated May 17, 2019 for U.S. Appl. No. 15/884,619; 29 Pages.
Response to U.S. Non-Final Office Action dated May 17, 2019 for U.S. Appl. No. 15/884,619; Response filed Jun. 24, 2019; 10 Pages.
U.S. Notice of Allowance dated Feb. 15, 2019 for U.S. Appl. No. 15/884,619; 12 Pages.
2nd Notice of Allowance dated Sep. 4, 2019 for U.S. Appl. No. 15/884,619; 16.
PCT International Search Report and Written Opinion dated Mar. 14, 2019 for International Application No. PCT/US2018/066995; 13 Pages.
European Examination Report dated Aug. 2, 2021 for European Application No. 18842507.8; 5 pages.
Response to Exam Report filed on Dec. 2, 2021 for European Application No. 18842507.8; 30 pages.
Intention of Grant dated Jun. 28, 2022 for European Application No. 18842507.8; 6 pages.
Japanese Office Action with English translation dated Jan. 4, 2022 for Japanese Application No. 2020-541381; 6 pages.
Response (with Machine English translation from Espacenet.com) to Japanese Office Action dated Jan. 4, 2022 for Japanese Application No. 2020-541381; Response filed Apr. 4, 2022; 23 pages.
Japanese Office Action with English translation dated Sep. 2, 2022 for Japanese Application No. 2020-541381; 9 pages.
U.S. Non-Final Office Action dated Apr. 22, 2021 for U.S. Appl. No. 16/553,641; 15 Pages.
Response to U.S. Non-Final Office Action dated Apr. 22, 2021 for U.S. Appl. No. 16/553,641; Response filed Jul. 19, 2021; 15 Pages.
U.S. Final Office Action dated Sep. 16, 2021 for U.S. Appl. No. 16/553,641; 11 Pages.
Response to U.S. Final Office Action dated Sep. 16, 2021 for U.S. Appl. No. 16/553,641; Response filed Oct. 12, 2021; 14 Pages.
U.S. Notice of Allowance dated Nov. 1, 2021 for U.S. Appl. No. 16/553,641; 12 Pages.
PCT International Search Report and Written Opinion dated Oct. 23, 2020 for International Application No. PCT/US2020/046883; 15 Pages.

(56) References Cited

OTHER PUBLICATIONS

PCT International Preliminary Report dated Mar. 10, 2022 for International Application No. PCT/US2020/046883; 9 Pages.
European Communication Pursuant to Rules 161/162 dated Mar. 16, 2022 for European Application No. 20768142.0; 3 Pages.
Response to European Office Action dated Mar. 16, 2022 for European Application No. EP20768142.0; Response filed Sep. 26, 2022; 13 pages.
U.S. Preliminary Amendment filed on Jul. 6, 2020 for U.S. Appl. No. 16/822,488; 16 Pages.
U.S. Non-Final Office Action dated May 12, 2022 for U.S. Appl. No. 16/822,488; 11 Pages.
Response to U.S. Non-Final Office Action dated May 12, 2022 for U.S. Appl. No. 16/822,488; Response filed May 20, 2022; 12 Pages.
U.S. Notice of Allowance dated Aug. 24, 2022 for U.S. Appl. No. 16/822,488; 10 Pages.
Extended European Search Report dated Jul. 29, 2021 for European Application No. 21156380.4; 9 Pages.
Response to Extended European Search Report (EESR) dated Jul. 29, 2021 for European Application No. 21156380.4; Response filed on Mar. 22, 2022; 17 Pages.
U.S. Notice of Allowance dated Jun. 16, 2022 for U.S. Appl. No. 16/921,191; 27 pages.
PCT International Search Report and Written Opinion dated Sep. 6, 2021 for International Application No. PCT/US2021/034432; 15 Pages.
U.S. Restriction Requirement dated May 28, 2021 for U.S. Appl. No. 16/553,633; 7 Pages.
Response to U.S. Restriction Requirement dated May 28, 2021 for U.S. Appl. No. 16/553,633; Response filed Jul. 28, 2021; 1 Page.
U.S. Notice of Allowance dated Sep. 13, 2021 for U.S. Appl. No. 16/553,633; 13 Pages.
Preliminary Amendment filed on file Oct. 28, 2021 for U.S. Appl. No. 17/502,391; 7 Pages.
Office Action dated Sep. 8, 2022 for U.S. Appl. No. 17/502,391; 8 Pages.
Response To Office Action dated Sep. 8, 2022, filed Sep. 28, 2022 for U.S. Appl. No. 17/502,391; 9 Pages.
Notice of Allowance dated Oct. 26, 2022 for U.S. Appl. No. 17/502,391; 11 Pages.
Extended European Search Report dated Feb. 25, 2026 for European Application No. 25196810.3, 7 pages.

* cited by examiner

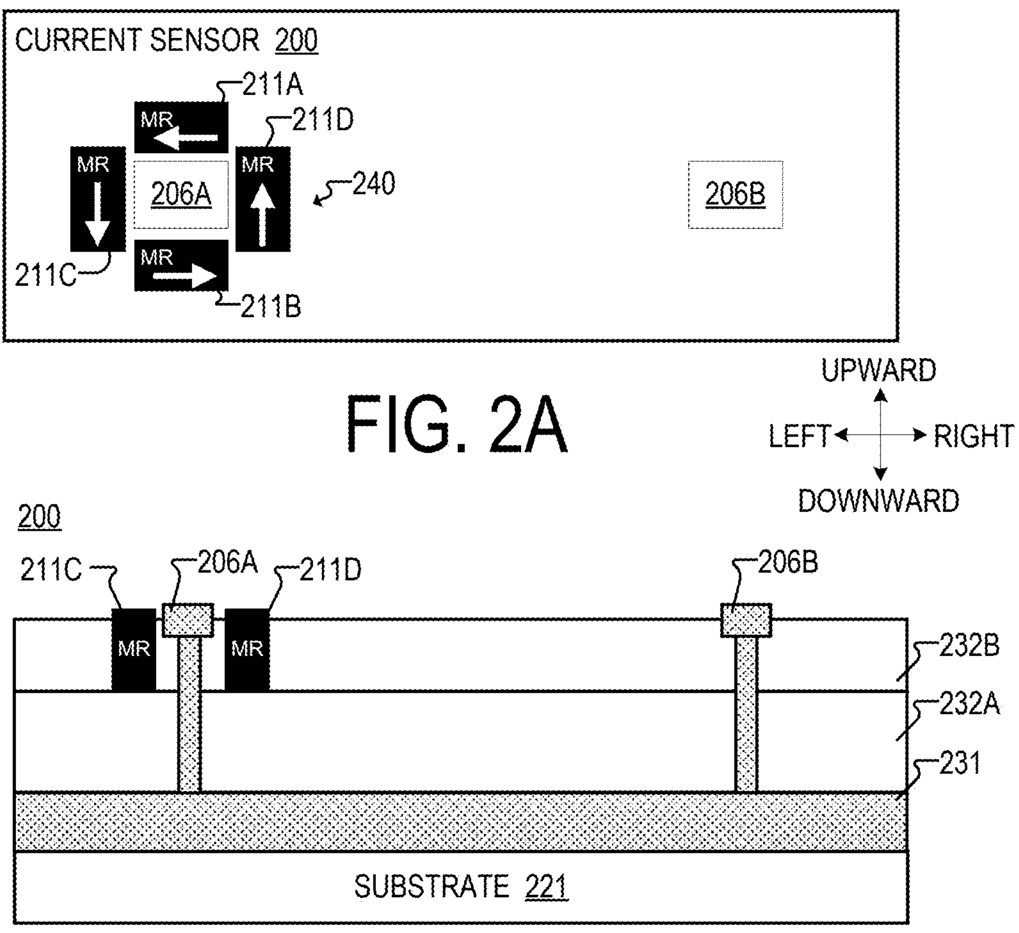
FIG. 2A
FIG. 2B
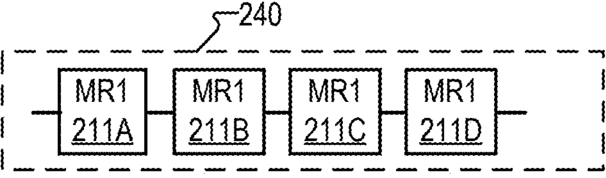
FIG. 2C

CURRENT SENSOR 200
211A
211D
MR
206A
206B
211C
211B

CURRENT SENSOR BUILT INTO SWITCHES

BACKGROUND

As is known, sensors are used to perform various functions in a variety of applications. Some sensors include one or more electromagnetic flux sensing elements, such as a Hall effect element, a magnetoresistive element, or a receiving coil to sense an electromagnetic flux associated with proximity or motion of a target object. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, an apparatus is provided, comprising: a substrate; a switching device that is formed over the substrate, the switching device including a gate layer, a source layer, and a drain layer; a first layer of dielectric material that is formed over the switching device; a first contact member that is electrically coupled to one of the gate layer, the source layer, and the drain layer, the first contact member being formed of at least one electrically-conductive material, the first contact member extending through the first layer of dielectric material; a plurality of first magnetic field sensing elements that is formed over the first layer of dielectric material, the plurality of first magnetic field sensing elements being arranged to at least partially surround the first contact member, the plurality of first magnetic field sensing elements having respective axes of maximum sensitivity that are arranged in a first pattern, the plurality of first magnetic field sensing elements being arranged, at least in part, to form a sensing circuit for measuring a level of electrical current through the first contact member, the first pattern being one of a clockwise pattern or a counterclockwise pattern; a first terminal that is coupled to the first contact member; and a sensing terminal that is coupled to the sensing circuit, the sensing terminal being configured to output, at least in part, a signal that is indicative of the level of electrical current through the first contact member, wherein the substrate, switching device, the first layer of dielectric material, and the plurality of first magnetic field sensing elements are encapsulated in a semiconductor package of the apparatus.

According to aspects of the disclosure, a current sensor is provided, comprising: a substrate; a metal layer that is formed over the substrate; a first layer of dielectric material that is formed over the metal layer; a first contact member that is coupled to the metal layer, the first contact member extending through the first layer of dielectric material; a second contact member that is coupled to the metal layer, the second contact member extending through the first layer of dielectric material; a plurality of first magnetic field sensing elements that is formed over the first layer of dielectric material, the plurality of first magnetic field sensing elements being arranged to at least partially surround the first contact member, the plurality of first magnetic field sensing elements having respective axes of maximum sensitivity that are arranged in a first pattern, the plurality of first magnetic field sensing elements being arranged, at least in part, to form a sensing circuit for measuring a level of electrical current through the metal layer; a first terminal that is coupled to the first contact member; a second terminal that is coupled the second contact member; and a third terminal that is coupled to the sensing circuit, the second terminal being configured to output, at least in part, a signal that is indicative of the level of electrical current through the first contact member.

According to aspects of the disclosure, an apparatus is provided, comprising: a substrate; a switching device that is formed over the substrate, the switching device including a gate layer, a source layer, and a drain layer, the gate layer, the source layer, and the drain layer being formed over the substrate and adjacent to each other, the source layer including a first base, the drain layer including a second base, the source layer including a plurality of first portions that extend from the first base towards the second base, the drain layer including a plurality of second portions that extend from the second base toward the first base, the plurality of first portions being interleaved with the plurality of second portions; a plurality of magnetic field sensing elements that is formed over the substrate, each of the magnetic field sensing elements being formed over a different one of a plurality of substrate regions, each of the plurality of substrate regions being situated between a different one of the plurality of first portions and one of the plurality of second portions that is directly adjacent to the first portion, wherein the plurality of magnetic field sensing elements being arranged, at least in part, to form a sensing circuit for measuring a level of electrical current through the switching device.

BRIEF DESCRIPTION OF THE DRAWINGS

The foregoing features may be more fully understood from the following description of the drawings in which:

FIG. 2A is a schematic top-down view of an example of a current sensor, according to aspects of the disclosure;

FIG. 2B is a schematic cross-sectional side view of an example of a current sensor, according to aspects of the disclosure;

FIG. 2C is a diagram of an example of a sensing circuit, according to aspects of the disclosure;

DETAILED DESCRIPTION

Figure 1A:
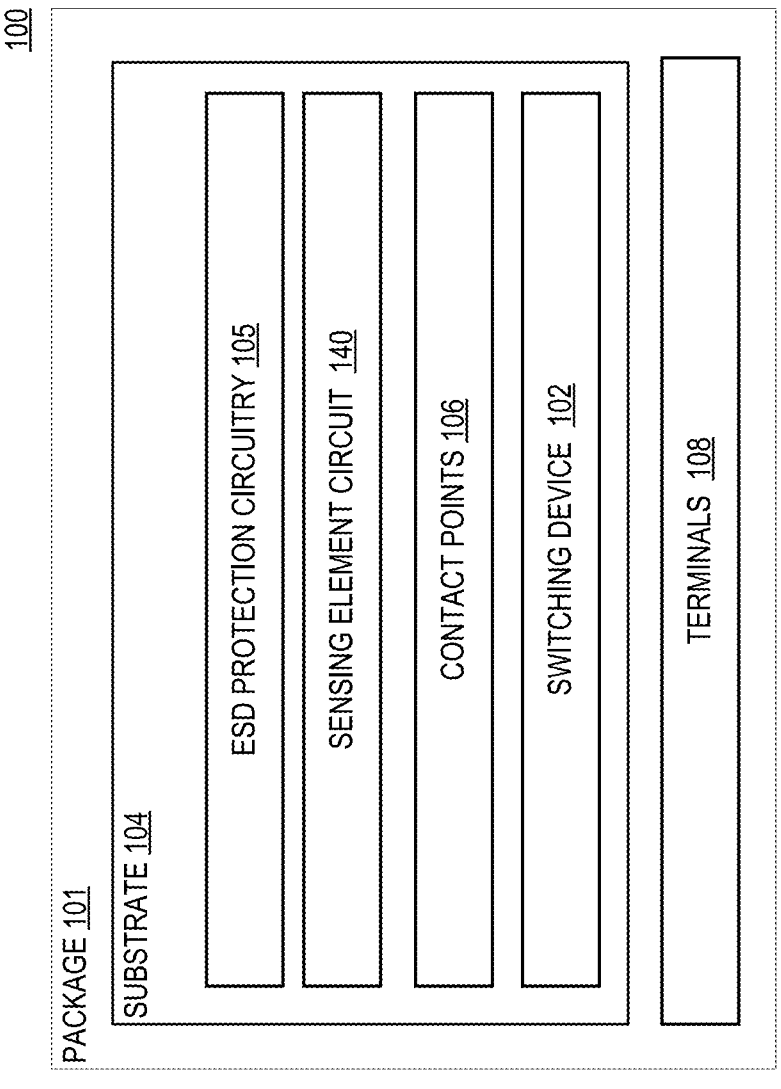
FIG. 1A is a diagram of an example of a switch, according to aspects of the disclosure.

FIG. 1A is a diagram of a switch 100, according to aspects of the disclosure. Switch 100 may include a semiconductor package 101 containing a substrate 104. Formed on the substrate 104 may be a switching device 102, a plurality of contact points 106, a sensing circuit 140, and an electrostatic discharge (ESD) protection circuitry 105. The switching device 102 may include a Metal Oxide Semiconductor Field Effect Transistor (MOSFET), a GaN switch, and/or any other switching device. Package 101 may be formed of any suitable type of dielectric material and it may be configured to encapsulate the substrate 104, as well as switching device 102, contact points 106, sensing circuit 140, and the ESD protection circuitry 105. In addition, package 101 may be configured to partially encapsulate terminals 108. Contact points 106 may include contact points 106A-C, which are discussed further below with respect to FIGS. 1B-I. Terminals 108A may include terminals 108A-G, which are discussed further below with respect to FIG. 1I. As used herein, the term terminal may refer to a contact pad, a pin, a receptacle, and/or any other suitable type of element that is configured to establish an electrical connection between switch 100 and external circuitry. Terminals 108A-G may be partially exposed through package 101. Terminals 108A-C may be coupled to contact points 106A-C, respectively, and terminals 108D-G may be coupled to sensing circuit 140. Sensing circuit 140 may include one or more magnetic field sensing elements that are configured to detect the level of electrical current that is passing through the switching device 102 when the switching device 102 is turned on.

Figure 1B:
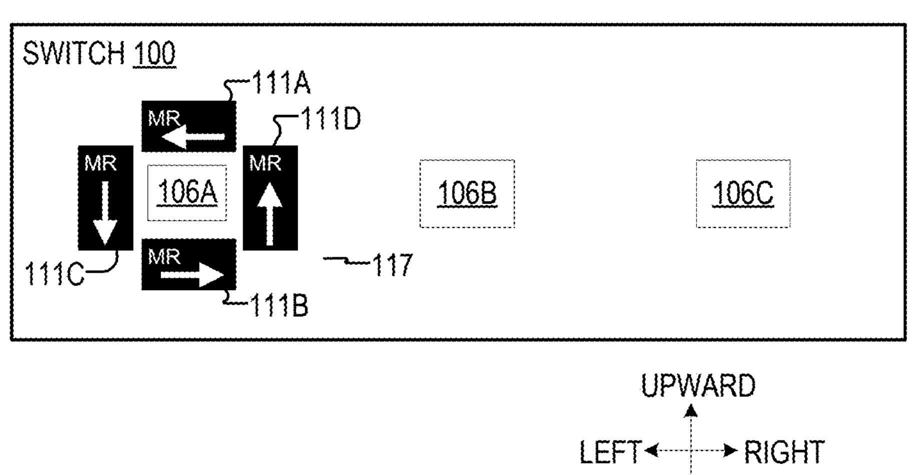
FIG. 1B is a schematic top-down view of a switch, according to aspects of the disclosure.
Figure 1B:
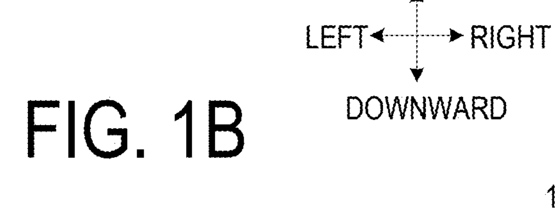
Figure 1C:
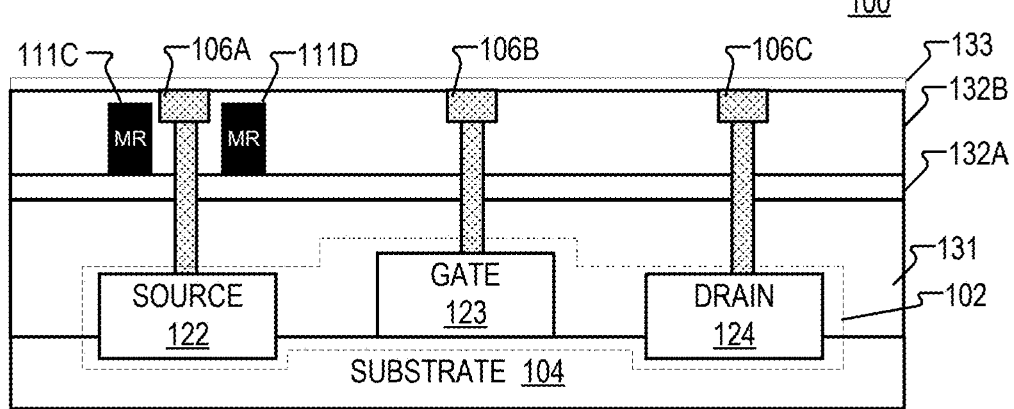
FIG. 1C is a schematic cross-sectional side view of a switch, according to aspects of the disclosure.
Figure 1D:
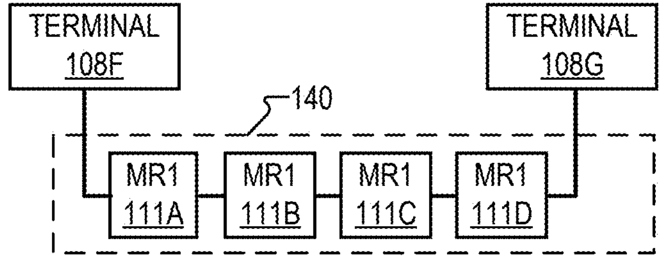
FIG. 1D is a diagram of an example of a sensing circuit, according to aspects of the disclosure.

FIGS. 1B-D show an example of switch 100, in accordance with one implementation. In the example of FIGS. 1B-D, switching device 102 includes a source layer 122, a gate layer 123, and a drain layer 124. The source layer 122 may include one or more material layers that are configured to implement the source of the switching device 102. The gate layer 123 may include one or more material layers that are configured to implement the gate of the switching device 102. The drain layer 124 may include one or more material layers that are configured to implement the drain of the switching device 102. It will understood that the present disclosure is not limited to any specific implementation of the source, drain, and gate layers of switching device 102. Furthermore, although in the present example, switching device 102 is a horizontal MOSFET switch, it will be understood that the present disclosure is not limited to any specific implementation of switching device 102. For example, in some implementations, switching device 102 may be implemented as vertical MOSFET, or other power switches that need to be monitored.

As illustrated, source layer 122, gate layer 123, and drain layer 124 may be formed on substrate 104, and they may be encapsulated in a layer 131. Layer 131 may be formed of Oxide, nitride, polyimide, benzocyclobutene (such as cylotine resin), and/or any other suitable type of dielectric material. A layer 132A may be formed over layer 131. Layer 132A may be formed of Oxide, nitride, polyimide, benzocyclobutene (such as cylotine resin), and/or any other suitable type of dielectric material. A layer 132B may be formed over layer 132A. Layer 132B may be formed of Oxide, nitride, polyimide, benzocyclobutene (such as cylotine resin). It will be understood that the present disclosure is not limited to any specific process for forming any of the layers, 122, 123, 124, 131, 132A, and 132B and/or any specific composition of the layers 122, 123, 124, 131, 132A, and 132B.

Contact point 106A may extend through layers 131 and 132A-B and it may come in electrical contact with source layer 122. Contact point 106A may be formed of metal and/or any other electrically conductive material. Contact point 106A may be coupled to terminal 108A by using a bonding wire (e.g., see FIG. 1I). Contact point 106B may extend through layers 131 and 132A-B and it may come in electrical contact with gate layer 123. Contact point 106B may be formed of metal and/or any other electrically conductive material. Contact point 106B may be coupled to terminal 108B by using a bonding wire (e.g., see FIG. 1I). Contact point 106C may extend through layers 131 and 132A-B and it may come in electrical contact with drain layer 124. Contact point 106C may be formed of metal and/or any other electrically conductive material. Contact point 106C may be coupled to terminal 108C by using a bonding wire (e.g., see FIG. 1I). In some implementations, the top of each of contact points 106A-C (i.e., the part of the contact point that is exposed through layer 132B) may be arranged to form a landing pad for connecting to the contact point's respective bonding wire. Although, in the present example, bonding wires are used to connect each of contact points 106 to a respective one of terminals 108, it will be understood that the present disclosure is not limited to any specific method for connecting any of contact points 106 to a respective one of terminals 108.

Sensing circuit 140 may be arranged to measure the level of electrical current through contact point 106A. Sensing circuit 140 may include sensing elements 111A-D. According to the present example, each of sensing elements 111A-D is a tunneling magnetoresistance (TMR) element. However, alternative implementations are possible in which any of sensing elements 111A-D is another type of magnetic field sensing element, such as a Hall element, a giant magnetoresistance (GMR) element, and/or any other suitable type of magnetic field sensing element. Sensing elements 111A-D may be arranged to surround contact point 106A. Although, in the present example, sensing elements 111A-D fully surround contact point 106A, alternative implementations are possible in which sensing elements 111A-D only partially surround contact point 106A. In such implementations, sensing elements 111A-D may define a C-shape or an L-shape around contact point 106A.

In the example of FIG. 1B, sensing elements 111B are arranged to form a ring around contact point 106A. Under the nomenclature of the present disclosure, a set of sensing elements is arranged to form a ring around a contact point if: (i) at least one of the sensing elements is disposed adjacent to the left side of the MR element, (ii) at least one of the sensing elements is disposed adjacent to the right side of the MR element, (iii) at least one of the sensing elements is disposed adjacent to the top side of the MR element, and (iv) at least one of the sensing elements is disposed adjacent to the left side of the MR element. Under the nomenclature of the present disclosure, a sensing element is disposed adjacent to a given side of a contact point, if the sensing element is disposed closer to the given side than to any of the remaining sides of the contact point.

The axis of maximum sensitivity of each of sensing elements 111A-D is represented by a white arrow that is superimposed over the depiction (i.e., black rectangle) of the sensing element. The direction of the arrow is the same as the direction of the axis of maximum sensitivity that is represented by the arrow. As illustrated, in the example of FIG. 1B, the respective axes of maximum sensitivity of sensing elements 111A-D may be arranged to define a counterclockwise pattern. Specifically, sensing element 111B may have an axis of maximum sensitivity that is oriented in the right direction. Sensing element 111D may have an axis of maximum sensitivity that is oriented in the upward direction. Sensing element 111A may have an axis of maximum sensitivity that is oriented in the left direction. Sensing element 111C may have an axis of maximum sensitivity that is oriented in the downward direction. Although the axes of maximum sensitivity of sensing elements 111A-D define a counterclockwise pattern in the present example, in other implementations they can define a clockwise pattern.

FIG. 1D shows an example of sensing circuit 140, according to aspects of the disclosure. In the example of FIG. 1D, sensing elements 111A-D are connected in series. As a result of this arrangement, the combined resistance of sensing elements 111A-D may increase or decrease in proportion to increases and decreases in the level of electrical current through contact point 106A. In implementations in which sensing circuit 140 is implemented as a serial circuit, the ends of the serial circuit may be connected to terminals 108F and 108G, respectively (e.g., see FIG. 1I). By Ampere's law, the integral of the magnetic field along a closed path will be proportional to the current flowing through the surface created by that path. That means the sum of the responses of sensing elements 111A-D will be proportional to the current flowing through contact point 106A (i.e., current flowing through switch 100). This is particularly powerful because any fields created by nearby currents (other connections, local printed circuit board (PCB) currents, etc.) will not impact the result, as long as they do not saturate the sensing. It is effectively (or partially) a stray field immune sensor.

Although, in the present example, sensing elements 111A-C are formed around contact point 106A, alternative implementations are possible in which sensing elements 111A-C are formed around one of contact points 106B and 106C. When sensing elements 111A-D are formed around contact point 106B, sensing elements 111A-D may be configured to measure the electrical current that is passing through the gate of switching device 102. When sensing elements 111A-D are formed around contact point 106C, they may be configured to measure the electrical current that is passing through the drain of switching device 102. Furthermore, in some implementations, a different group of magnetic field sensing elements may be formed around two or more of contact points 106A-C. Each group may be configured as discussed above with respect to sensing elements 111A-D, and may constitute a different sensing circuit.

Figure 1E:
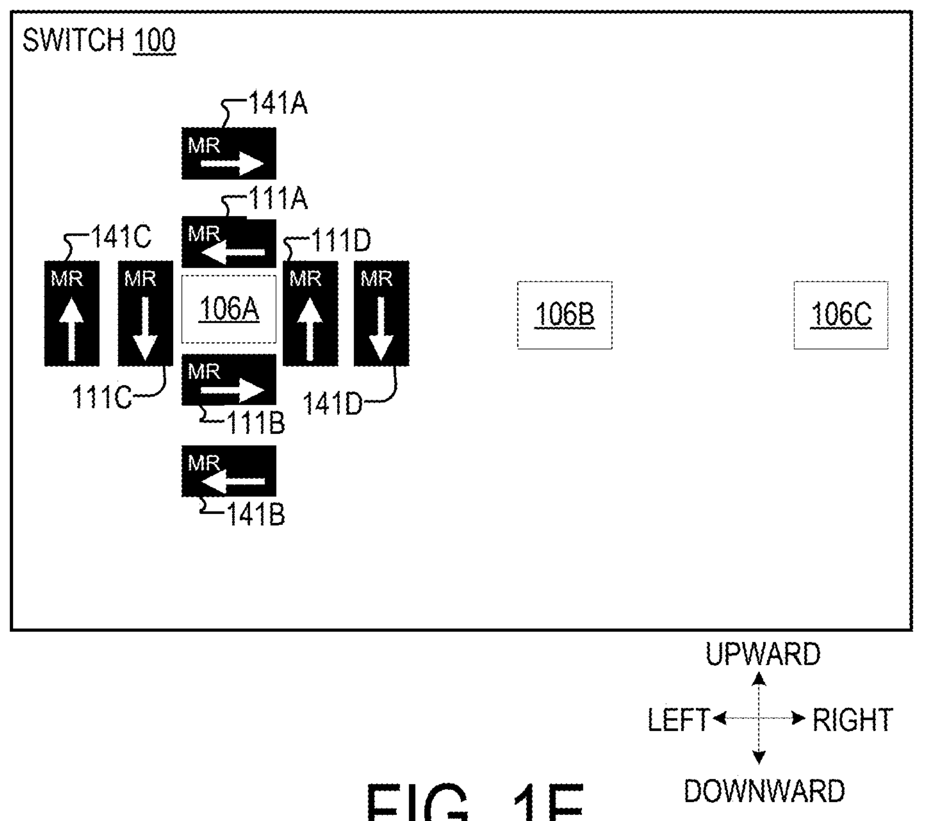
FIG. 1E is a schematic top-down view of a switch, according to aspects of the disclosure.
Figure 1F:
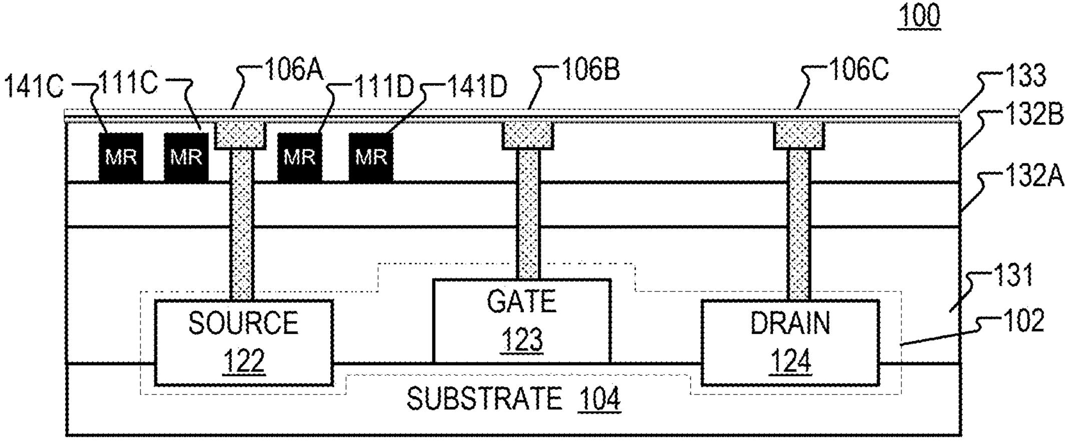
FIG. 1F is a schematic cross-sectional side view of a switch, according to aspects of the disclosure.

FIGS. 1E-F show an example of switch 100, in accordance with another implementation. The implementation shown in FIGS. 1E-F is nearly identical to the implementation shown in FIGS. 1B-C but for switching circuit 140 being a bridge circuit that includes two groups of sensing elements—sensing elements 111A-D and sensing elements 141A-D. Sensing elements 111A-D may be arranged in the manner discussed above with respect to FIGS. 1B-C. Specifically, sensing elements 111A-D may be arranged to form a ring around contact point 106A, and their axes of maximum sensitivity may follow a counterclockwise pattern. Sensing elements 141A-D may also be arranged to form a ring around contact point 106A. However, the axes of maximum sensitivity of sensing elements 141A-D may be arranged in a clockwise pattern.

According to the present example, each of sensing elements 141A-D is a tunneling magnetoresistance (TMR) element. However, alternative implementations are possible in which any of sensing elements 141A-D is another type of sensing element, such as a Hall element, a giant magnetoresistance (GMR) element, and/or any other suitable type of magnetic field sensing element. Sensing elements 141A-D may be arranged to surround contact point 106A. Although, in the present example, sensing elements 141A-D fully surround contact point 106A, alternative implementations are possible in which sensing elements 141A-D only partially surround contact point 106A. In such implementations, sensing elements 141A-D may define a C-shape or an L-shape around contact point 106A.

Sensing elements 141A-D may be arranged in a ring around contact point 106A. The axis of maximum sensitivity of each of sensing elements 141A-D is represented by a white arrow that is superimposed over the depiction (i.e., black rectangle) of the sensing element. The direction of the arrow is the same as the direction of the axis of maximum sensitivity that is represented by the arrow. As illustrated, in the example of FIG. 1B, the axes of maximum sensitivity of sensing elements 141A-D may have axes of maximum sensitivity that are arranged in a clockwise pattern. Specifically, sensing element 141B may have an axis of maximum sensitivity that is oriented in the left direction. Sensing element 141D may have an axis of maximum sensitivity that is oriented in the downward direction. Sensing element 141A may have an axis of maximum sensitivity that is oriented in the right direction. Sensing element 141C may have an axis of maximum sensitivity that is oriented in the upward direction.

Figure 1G:
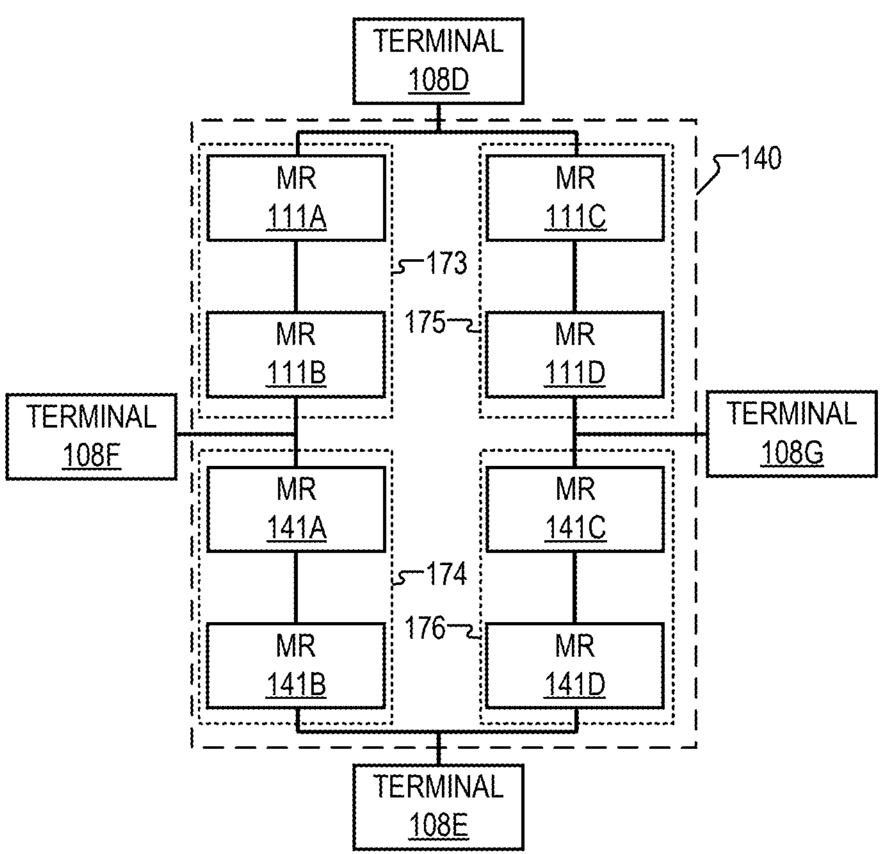
FIG. 1G is a diagram of an example of a sensing circuit, according to aspects of the disclosure.

FIG. 1G shows an example of sensing circuit 140, according to aspects of the disclosure. In the example of FIG. 1G, circuit 140 is a full bridge circuit including portions 173, 174, 175, and 176. Portion 173 includes sensing elements 111A and 111B and is coupled between terminals 108D and 108F. Portion 174 includes sensing elements 141A and 141B and is coupled between terminals 108F and 108E. Portion 175 includes sensing elements 111C and 111D and is coupled between terminals 108D and 108G. Portion 176 includes sensing elements 141C and 141D and is coupled between terminals 108E and 108G.

Figure 1H:
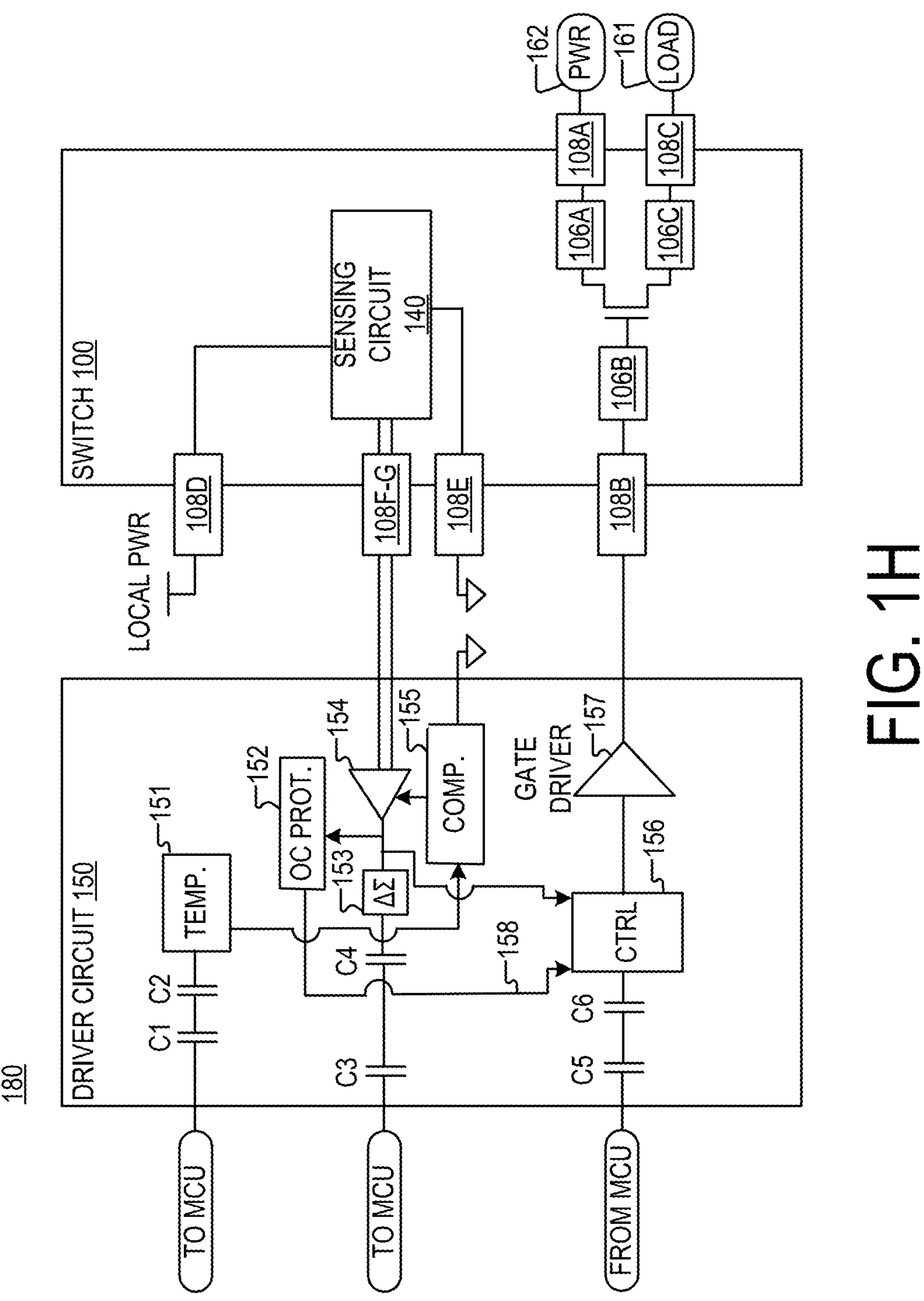
FIG. 1H is a diagram of an example of a system, according to aspects of the disclosure.

FIG. 1H is a diagram of an example of system 180, according to aspects of the disclosure. System 180 may include a driver circuit 150 and the switch 100. Driver circuit 150 may be coupled to a microcontroller unit (MCU), not shown, and it may be configured to turn switch 100 on and off in response to signals received from the MCU. Driver circuit 150 may include a controller 156, a gate driver 157, a compensation circuit 155, an amplifier 154, an analog to digital converter (ADC) 153, an overcurrent protection circuit 152, and a temperature sensor 151.

Switch 100 may be configured to drive a load 161. Load 161 may include an electric motor and/or any other suitable type of device or machinery. Load 161 may be coupled to contact point 106C of switch 100 via terminal 108C. A power source 162 may be coupled to contact point 106A of switch 100, via terminal 108A. Contact point 106B may be coupled to gate driver 157 via terminal 108B. When switch 100 is turned on, electrical current may flow through switch 100 from power source 162 to load 161. As discussed above, sensing circuit 140 may measure the level of electrical current that is flowing through switch 100 (i.e., the electrical current that is flowing through contact points 106A and 106C) and output an indication of the measured current on terminals 108F-G. In the example of FIG. 1H, sensing circuit 140 is configured as a full bridge circuit and connected to terminals 108D-G. In this regard, sensing circuit 140 may receive power on terminal 108D, and it may be coupled to ground via terminal 108E. A differential signal that is indicative of the level of electrical current measured by sensing circuit 140 may be output on terminals 108F-G and received by amplifier 154.

Temperature sensor 151 may be configured to measure the temperature of switch 100 (and/or driver circuit 150) and provide an indication of the temperature to compensation circuit 155. Compensation circuit 155 may adjust the gain of amplifier 154 based on the signal received from temperature sensor 151. Amplifier 154 may amplify the signal output from sensing bridge 154 (based on the output of compensation circuit 155) and provide the amplified signal to ADC 153. ADC 153 may digitize the amplified signal and provide the digitized signal to the MCU. It will be recalled that the digitized signal is indicative of the electrical current through switch 100 (i.e., the electrical current used to drive the load 161). Temperature sensor 151 may be coupled to the MCU via capacitors C1 and C2. ADC 153 may be coupled to the MCU via capacitors C3 and C4. Controller 156 may be coupled to the MCU via capacitors C5 and C6. Capacitors C1-C6 may be arranged to form a dielectric barrier between driver circuit 150 and the MCU.

Controller 156 may include a general-purpose processor, a special-purpose processor, an application-specific circuit, and/or any other suitable type of processing circuitry. Controller 156 may be configured to turn switch 100 on and off in response to a control signal that is received from the MCU. Furthermore, controller 156 may be configured to turn off switch 100 in response to a signal 158 that is generated by overcurrent protection circuit 152. Signal 158 may be generated based on the output of amplifier 154. Signal 158 may have a first value when the level of electrical current measured by sensing circuit 140 is above a predetermined threshold. Signal 158 may have a second value when the level of electrical current measured by sensing circuit 140 is below the predetermined threshold. Controller 156 may turn off switch 100 in response to the measured level of electrical current rising above the predetermined threshold, and signal 158 assuming the first value as a result. In other words, in one example, controller 156 may be configured to provide overcurrent protection for load 161 independently of the MCU.

Circuit 152, amplifier 154, ADC 153, compensation circuit 155, and controller 156 are individually or jointly an example of processing circuitry that is configured to generate an output signal, such as the signal that is output by ADC 153. Although, in the example of FIG. 1H, circuit 152, amplifier 154, ADC 153, compensation circuit 155, and controller 156 are part of the driver circuit 150, it will be understood that alternative implementations are possible in which one or more of circuit 152, amplifier 154, ADC 153, compensation circuit 155, and controller 156 are integrated into switch 100, and formed on substrate 104. In such implementations, the adjustments to the raw signal produced by sensing circuit 140 may be performed on the die of switch 100. Similarly, in such implementations, switch 100 may also be configured to provide overcurrent protection.

Figure 1I:
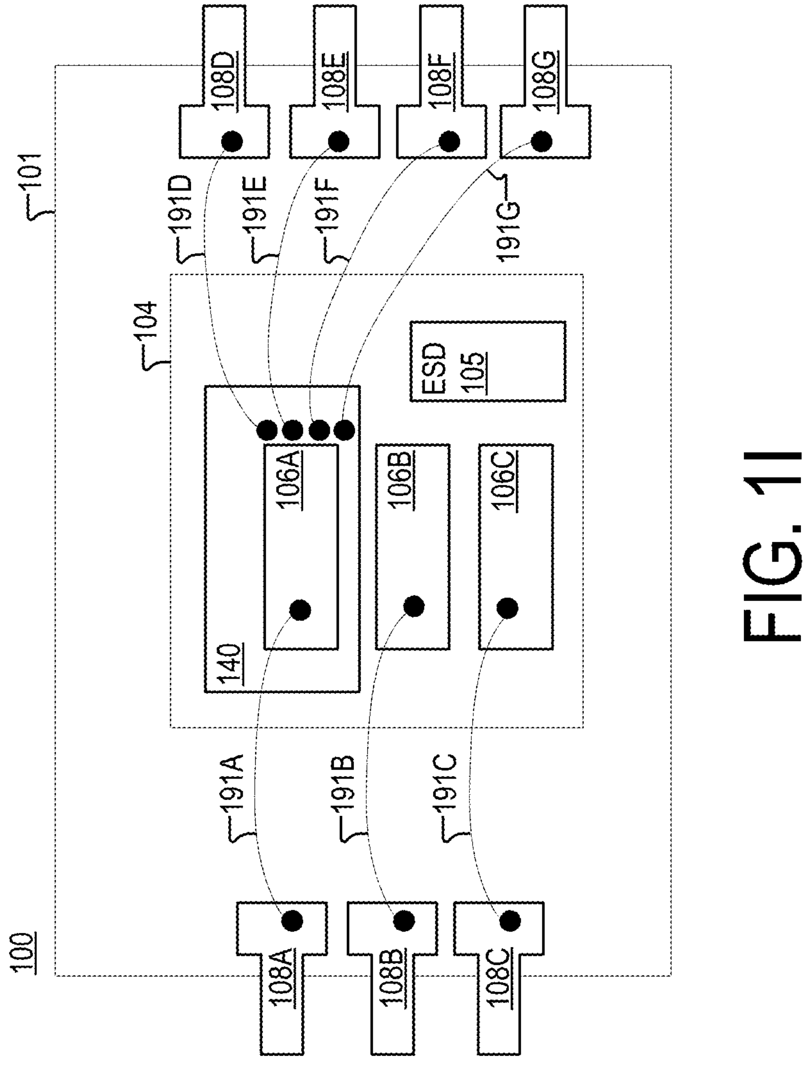
FIG. 1I is a schematic top-down view of an example of a switch package, according to aspects of the disclosure.

In the example of FIG. 1H-I, sensing circuit 140 is configured as discussed above with respect to FIGS. 1E-G. However, alternative implementations are possible in which sensing circuit 140 is configured as discussed above with respect to FIGS. 1B-D. In such implementations, terminals 108D-E may be omitted. Although, in the present example, compensation circuit 155 is configured to adjust only the gain of amplifier 154, alternative implementations are possible in which compensation circuit 155 includes circuitry for adjusting the offset of the input or output of amplifier 154. Stated succinctly, the present disclosure is not limited to any specific method for performing temperature or other compensation on the output of sensing circuit 140.

FIG. 1I is a schematic top-down view of switch 100, according to aspects of the disclosure. In the example of FIG. 1I, contact point 106A is coupled to terminal 108A via a bonding wire 191A. Contact point 106B is coupled to terminal 108B via a bonding wire 191B. Contact point 106C is coupled to terminal 108C via a bonding wire 191C. Furthermore, sensing circuit 140 is coupled to terminals 108D-G via bonding wires 191D-G, respectively. As noted above, ESD protection circuitry 105 may be formed on the same die (e.g., substrate 104) with sensing circuit 140. A layer of high-voltage gel 133 (shown in FIGS. 1C and 1F) may be formed between contact points 106A-C and bonding wires 191A-G.

Furthermore, FIG. 1I illustrates that the wire bonds connecting sensing circuit 140 to the terminals of switch 100 may be disposed on one side of package 101 and the wire bonds connecting contact points 106A-C to the terminals of switch 100 may be disposed on the other side of package 101. Placing wire bonds 191A-C on one side of package 101 and placing wire bonds 191D-G on the other side of package 101 is advantageous because it may help reduce noise coupling between wire bonds 191A-C and sensing circuit 140.

Figure 2D:
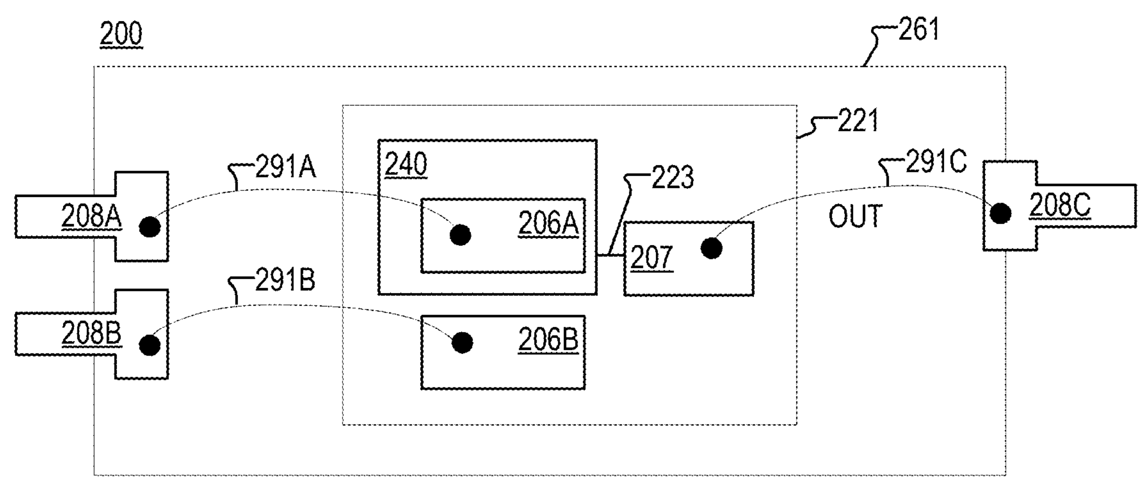
FIG. 2D is a schematic top-down view of an example of a current sensor package, according to aspects of the disclosure.

In some implementations, the axes of maximum sensitivity of sensing elements 111A-D may be oriented in the same direction (as shown in FIG. 2D), in which case sensing elements 111 would implement a zero-referenced current detector. By this one can have sensing elements around contact point 106A (and/or contact point 106B) areas and if the current is evenly distributed all the sensing elements move the same. An even current distribution will result in a net zero change in the measurement, or a small resistance difference below a threshold level of acceptable current distribution. In this example, sensing elements 111A-D may be arranged in a bridge configuration, or even just a serial configuration, such as the configuration shown in FIG. 1D.

Furthermore, in some implementations, sensing elements 111A-D may form a ring around contact point 106A and sensing elements 141A-D may form a ring around contact point 106B. In this example, sensing elements 111A-D and 141A-D may be arranged as discussed with respect to FIGS. 2E-F (i.e., their axes of maximum sensitivity may form clockwise and counterclockwise patterns), and they may form the bridge circuit shown in FIG. 1G.

In yet another example, sensing elements 111A-D may form a ring around contact point 106A, and sensing elements 141A-D may form a ring around contact point 106B. In this example, sensing elements 141A-D and sensing elements 111A-D may have axes of maximum sensitivity that are oriented in the same direction (e.g., see FIG. 2E), and they may be connected in a bridge circuit such as the one shown in FIG. 1G. In this configuration, sensing elements 111A-D and 141A-D may provide a very crude check on current distribution. If the current is very high and is not evenly distributed sensing elements 111A-D may clip at the extreme (say high resistance of the sensing elements) and sensing elements 141A-D may not clip at the lower field levels, as one example.

Figure 1J:
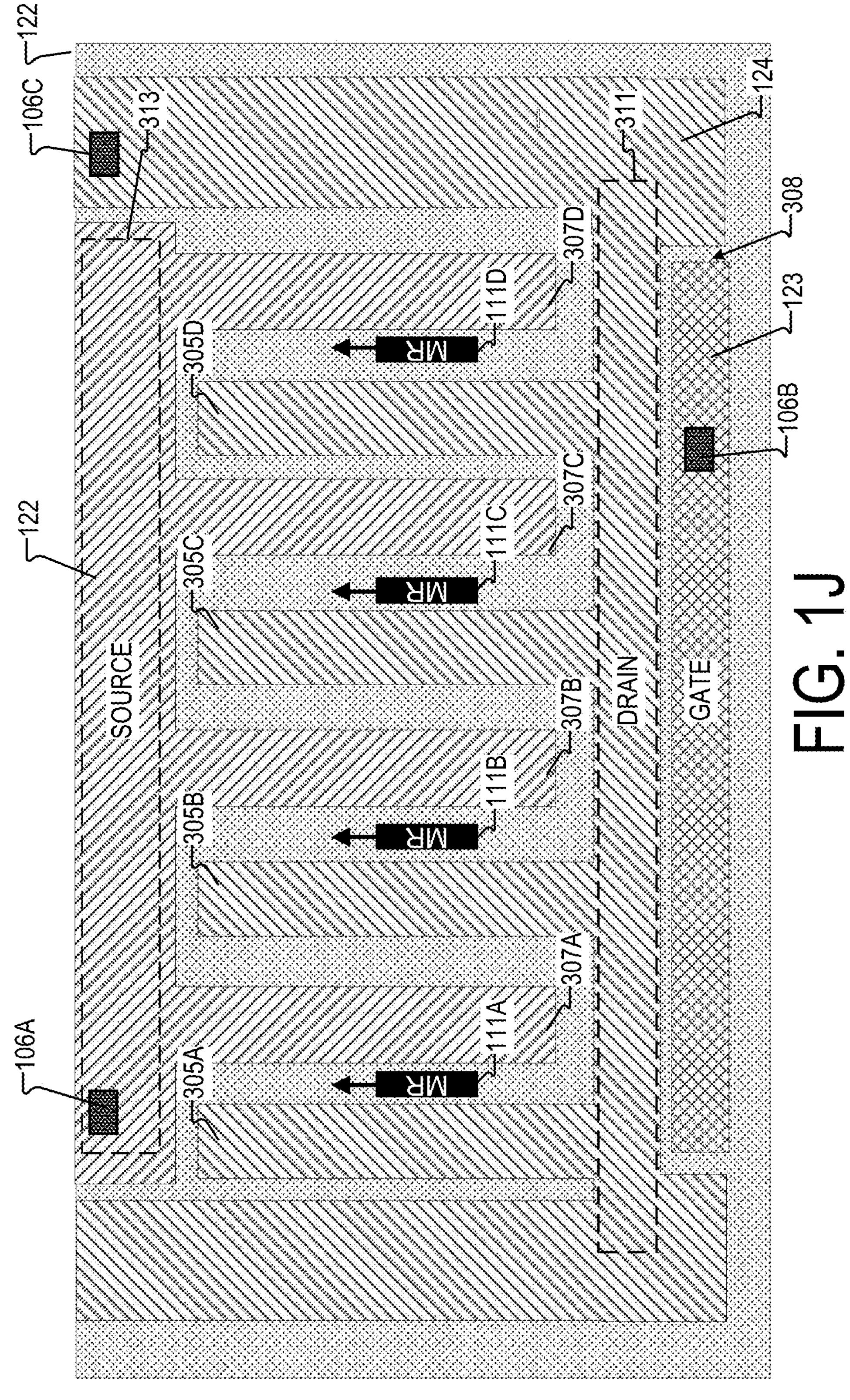
FIG. 1J is a diagram of an example of a switch, according to aspects of the disclosure.

FIG. 1J is a schematic top-down view of switch 100 in accordance with another implementation. In the example of FIG. 1J, switch 100 is GaN switch. The layers 122, 123, and 124 may be implement as doped layers that are grown on a GaN substrate. However, the present disclosure is not limited to any specific method for implementing the layers 122, 123, and 124. The source layer 122 may be arranged to define a plurality of fingers 307A-D. The drain layer 124 may be arranged to define a plurality of fingers 305A-D that are interleaved with fingers 307A-D. Fingers 305A-D may extend from a base portion 311 of layer 124 (hereinafter "base 311") and fingers 307A-D may extend from a base portion 313 of layer 122 (hereinafter "base 313"). As can be readily appreciated, fingers 305A-D may be integral with base 311, and fingers 307A-D may be integral with base 313. Sensing element 111A may be formed on substrate 104 in a gap between fingers 305A and 307A. Sensing element 111B may be formed on substrate 104 in a gap between fingers 305B and 307B. Sensing element 111C may be formed on substrate 104 in a gap between fingers 305C and 306C. Sensing element 111D may be formed on substrate 104 in a gap between fingers 305D and 307D. In the example of FIG. 1D, each of sensing elements 111A-D may have an axis of sensitivity that is oriented in the same direction (e.g., an upward direction) relative to the edges of substrate 104. As discussed above with respect to FIGS. 1A-I, sensing elements 111A-D may be coupled in series or in a bridge circuit. Sensing elements 111A-D may be connected to each other to form sensing circuit 140, as discussed above with respect to FIGS. 1A-I. In the example of FIG. 1J, sensing elements may be vertical Hall elements. However, the present disclosure is not limited to any specific implementation of sensing elements 111A-D.

FIGS. 2A-B show an example of a current sensor 200, according to aspects of the disclosure. As illustrated, current sensor 200 may include a substrate 221, a metal layer 231, a dielectric layer 232A, and a dielectric layer 232B. Substrate 221 may include a silicon substrate and/or any other type of substrate. Metal layer 231 may be formed over substrate 221. A layer of dielectric material 232A may be formed over metal layer 231. A sensing circuit 240 may be formed on dielectric layer 232A. A dielectric layer 232B may be formed over dielectric layer 232A and configured to at least partially encapsulate the sensing elements in sensing circuit 240. Layer 231 may be formed of Oxide, nitride, polyimide, benzocyclobutene (such as cylotine resin), and/or any other suitable type of dielectric material. Layer 232A may be formed of Oxide, nitride, polyimide, benzocyclobutene (such as cylotine resin), and/or any other suitable type of dielectric material. Layer 232B may be formed of Oxide, nitride, polyimide, benzocyclobutene (such as cylotine resin), and/or any other suitable type of dielectric material. Each of the layers of 231, 232A, and 232B may be formed by using chemical vapor deposition (CVD) and/or in any other suitable manner. It will be understood that the present disclosure is not limited to any specific process for forming any of the layers 231, 232A and 232B and/or any specific composition of the layers 231, 232A and 232.

Contact point 206A may extend through layers 232A-B and it may come in electrical contact with metal layer 231. Contact point 206A may be formed of metal and/or any other electrically conductive material. Contact point 206B may extend through layers 232A-B and it may come in electrical contact with metal layer 231. Contact point 206B may be formed of metal and/or any other electrically conductive material. In operation, when current sensor 200 is integrated into a larger system, electrical current may flow through the conductor formed by contact points 206A-B and metal layer 231, and the sensing elements in the sensing circuit 240 may measure the level of the electrical current. Contact points 206A-B may be implemented as vias that are exposed through layers 232B-B and connected through respective bonding wires to terminals 208A-B. (See FIG. 2D).

Sensing circuit 240 may include sensing elements 211A-D. Sensing elements 211A-D may be the same or similar to sensing elements 111A-D (shown in FIG. 1B), and they may be configured in the same manner. The axis of maximum sensitivity of each of sensing elements 211A-D is represented by a white arrow that is superimposed over the depiction (i.e., black rectangle) of the sensing element. As illustrated, the respective axes of maximum sensitivity of sensing elements 211A-D are arranged to define a counter-clockwise pattern. Although, in the present example, sensing elements 211A-D define a ring around contact point 206A, and thus surround completely contact point 206A, alternative implementations are possible in which sensing elements 211A-D surround contact point 206A only partially. In such implementations, sensing elements 211A-D may define a C-shape or an L-shape around contact point 206A.

FIG. 2C shows an example of sensing circuit 240, according to aspects of the disclosure. In the example of FIG. 2C, sensing elements 211A-D are connected in series. As a result of this arrangement, the combined resistance of sensing elements 211A-D may increase or decrease in proportion to increases and decreases of the level of electrical current through contact point 206A.

FIG. 2D is a schematic top-down view of current sensor 200, according to one example. FIG. 2D illustrates that current sensor 200 may be encapsulated in a sensor package 261 having terminals 208A-C. Terminal 208A may be coupled to contact point 206A and terminal 208B may be coupled to contact point 206B. In another aspect, FIG. 2D illustrates that current sensor 200 may include a processing circuitry 207. Circuitry 207 may include any suitable type of analog or digital circuitry. By way of example, circuitry 207 may include at least one of: one or more amplifiers, one or more demodulators, a temperature sensor, one or more analog-to-digital converters (ADCs), one or more digital-to-analog converters (DAC), a general-purpose processor or an application specific processor. Circuitry 207 may be configured to receive a signal 223 that is generated by sensing circuit 240 and output an output signal OUT on terminal 208C. Signal 223 may be generated in response to a magnetic field that is produced by contact point 206A when an electrical current passes through contact point 206A. The output signal OUT may be indicative of the level of electrical current that is passing through contact point 206A. In some implementations, to generate the output signal OUT, circuitry 207 may demodulate the signal 223, correct the gain and/or offset of signal 223, and/or perform any other action that is performed by current sensors. It will be understood that the present disclosure is not limited to any specific implementation of circuitry 207 and/or any specific method for generating the signal OUT. In the example of FIG. 2D, terminal 208A is coupled to contact point 206A via a boding wire 291A, terminal 208B is coupled to contact point 206B via a bonding wire 291B, and circuitry 207 is coupled to contact terminal 208C via a bonding wire 291C. Although not shown, a layer of high-voltage gel may be placed over contact points layer 232B before package 261 is molded.

Figure 2E:
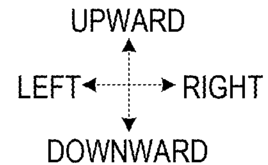
FIG. 2E is a schematic top-down view of an example of a current sensor, according to aspects of the disclosure.

FIG. 2E is a diagram of current sensor 200 in accordance with another implementation. In the example of FIG. 2E, the axis of maximum sensitivity of each of sensing elements 211A-D, is oriented in the same direction (e.g., an upward direction). In the example of FIG. 2E, sensing elements 211A-D may be connected in series or in a bridge circuit. In some respects, an even current distribution across contact point 206A may result in a small change in the resistance of sensing circuit 240, which can be used in turn to detect the level of electrical current through contact point 206A.

Figure 2F:
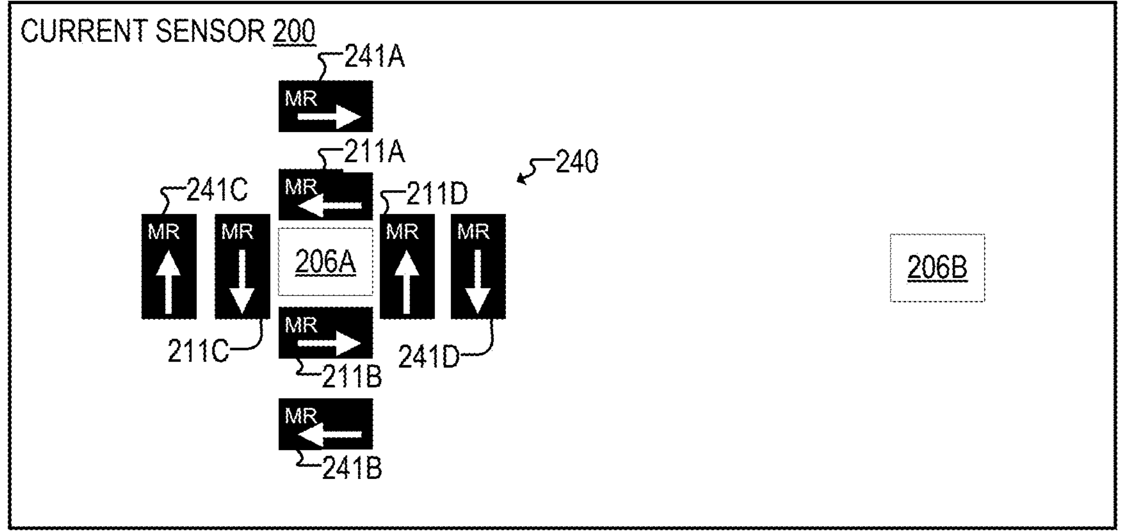
FIG. 2F is a schematic top-down view of an example of a current sensor, according to aspects of the disclosure.
Figure 2G:
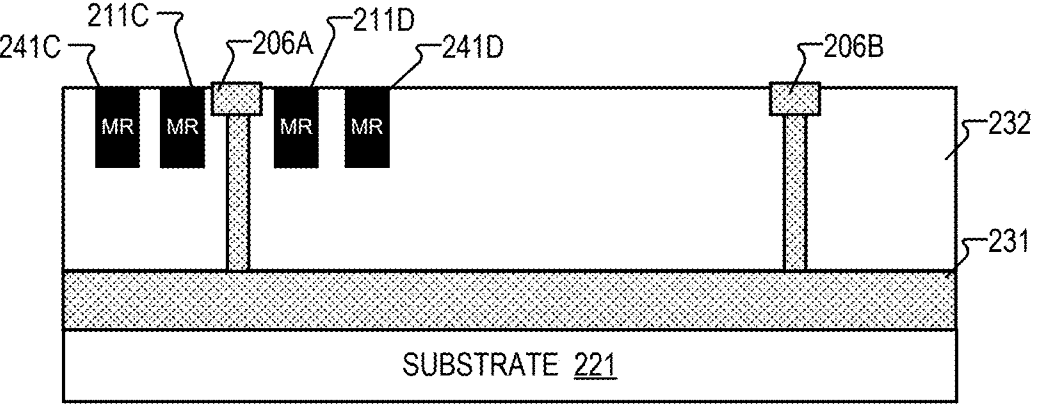
FIG. 2G is a schematic cross-sectional side view of an example of a current sensor, according to aspects of the disclosure.
Figure 2H:
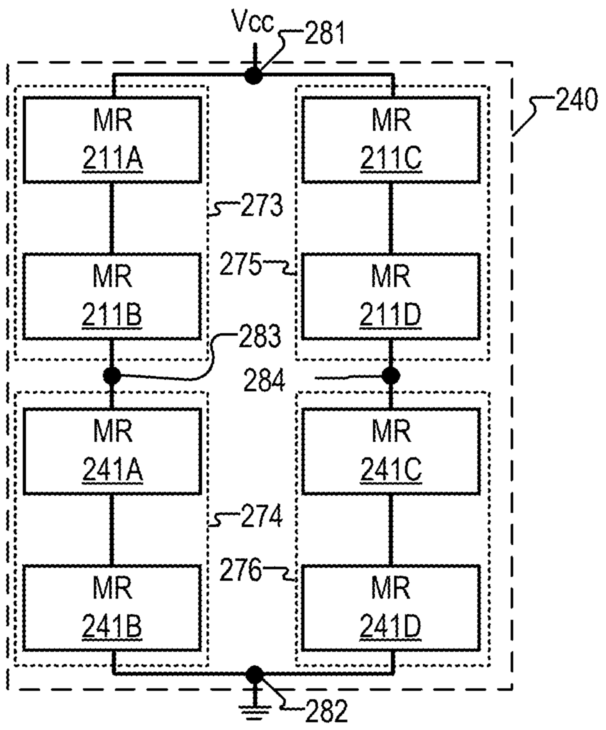
FIG. 2H is a diagram of an example of a sensing circuit, according to aspects of the disclosure.

FIGS. 2F-H show an example of current sensor 200 in accordance with another implementation. The implementation shown in FIGS. 2F-H is nearly identical to the implementation shown in FIGS. 2B-C but for switching circuit 240 being a bridge circuit that includes two groups of sensing elements—sensing elements 211A-D and sensing elements 241A-D. Sensing elements 211A-D may be arranged in the manner discussed above with respect to FIGS. 2A-B. Specifically, sensing elements 211A-D may be arranged to form a ring around contact point 206A. Sensing elements 241A-D may also be arranged to form a ring around contact point 206A. Sensing elements 241A-D may be the same or similar to sensing elements 141A-D (shown in FIG. 1E). Specifically, the axes of maximum sensitivity of sensing elements 241A-D may be arranged in a clockwise pattern. Although, in the present example, sensing elements 241A-D define a ring around contact point 206A, and thus surround completely contact point 206A, alternative implementations are possible in which sensing elements 241A-D surround contact point 206A only partially. In such implementations, sensing elements 241A-D may define a C-shape or an L-shape around contact point 206A. Although in the present example sensing elements 241A-D are formed around contact point 206A, alternative implementations are possible in which sensing elements 241A-D are formed around contact point 206B. Additionally or alternatively, in some implementations, the axes of maximum sensitivity of sensing elements 211A-D and 241A-D may have the same orientation (e.g., see FIG. 2E).

FIG. 2H shows an example of sensing circuit 240, according to aspects of the disclosure. As illustrated, sensing elements 211A-D and 241A-D may be connected in a full bridge circuit. The full bridge circuit may include nodes 281-284. Node 281 may be coupled to a voltage source and node 282 may be coupled to ground. Furthermore, the full bridge circuit may include portions 273, 274, 275, and 276. Portion 273 includes sensing elements 211A and 211B, and is coupled between nodes 281 and 283. Portion 274, includes sensing elements 241A and 241B, and is coupled between nodes 283 and 282. Portion 275 includes sensing elements 211C and 211D and is coupled between nodes 281 and 284. Portion 276 includes sensing elements 211C and 211D and is coupled between nodes 282 and 284. Sensing circuit 240 may be arranged to receive power on node 281, and node 282 may be coupled to ground. Nodes 283 and 284 may be coupled to circuitry 207. The signal output on nodes 283 and 284 may be indicative of the level of electrical current through contact point 206B. The signal output on nodes 283 and 284 may be the same or similar to signal 223, and it may be provided to processing circuitry 207 for further processing (e.g., see FIG. 2D).

The examples presented with respect to FIGS. 1A-2H are not mutually exclusive but rather serve as individual examples to illustrate various aspects of the disclosed technology. Any of the ideas discussed with respect to FIGS. 1A-J can be applied with respect to the current sensor of FIG. 2A-H, as the current sensor of these figures, for the purposes of the disclosure, has many of the characteristics of a switch that is turned on at all times. Similarly, any of the ideas discussed with respect to FIGS. 2A-H, may be applied to the implementations of FIGS. 1A-J, especially, the idea of the respective axes of maximum sensitivity of the sensing elements in a ring having the same orientation (e.g., see FIG. 2E), or the idea of processing circuitry being formed on the same die as the sensing circuit (e.g., see FIG. 2D). The term "terminal", when permitted by context, may refer to a pin, a contact pad, a receptacle, a socket, and/or any other element that is arranged to form an electrical connection. Throughout the disclosure, the terms "contact point" and "contact member" are used interchangeably.

A magnetic-field sensing element can be, but is not limited to, a Hall Effect element a magnetoresistance element, or an inductive coil. As is known, there are different types of Hall Effect elements, for example, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). The phrase "set of magnetic field elements" shall mean "one or more magnetic field sensing elements". For example, and without limitation, each or any of sensing elements 111A-D, 141A-D, 211A-D, and 241A-D may include any of the listed magnetic field sensing element types.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special-purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., an addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. An apparatus, comprising:

a substrate;

a switching device that is formed over the substrate, the switching device including a gate layer, a source layer, and a drain layer;

a first layer of dielectric material that is formed over the switching device;

a first contact member that is electrically coupled to one of the gate layer, the source layer, and the drain layer, the first contact member being formed of at least one electrically-conductive material, the first contact member extending through the first layer of dielectric material;

a plurality of first magnetic field sensing elements that is formed over the first layer of dielectric material, the plurality of first magnetic field sensing elements being arranged to at least partially surround the first contact member, the plurality of first magnetic field sensing elements having respective axes of maximum sensitivity that are arranged in a first pattern, the plurality of first magnetic field sensing elements being arranged, at least in part, to form a sensing circuit for measuring a level of electrical current through the first contact member, the first pattern being one of a clockwise pattern or a counterclockwise pattern;

a first terminal that is coupled to the first contact member; and a sensing terminal that is coupled to the sensing circuit, the sensing terminal being configured to output, at least in part, a signal that is indicative of the level of electrical current through the first contact member, wherein the substrate, switching device, the first layer of dielectric material, and the plurality of first magnetic field sensing elements are encapsulated in a semiconductor package of the apparatus.

2. The apparatus of claim 1, wherein the sensing circuit includes a serial circuit.

3. The apparatus of claim 1, wherein the sensing circuit includes a bridge circuit.

4. The apparatus of claim 1, further comprising a second layer of dielectric material that is formed over the first layer of dielectric material and configured to at least in part encapsulate the plurality of first magnetic field sensing elements.

5. The apparatus of claim 1, further comprising a layer of high-voltage gel that is formed over the first layer of dielectric material and encapsulated in the semiconductor package.

6. The apparatus of claim 1, wherein the signal that is indicative of the level of electrical current through the first contact member is generated, at least in part, by the sensing circuit.

7. The apparatus of claim 1, further comprising a processing circuitry that is formed on the substrate, wherein the signal that is indicative of the level of electrical current through the first contact member is generated by the processing circuitry based on one or more signals that are generated by the sensing circuit, the processing circuitry including at least one of analog or digital circuitry.

8. The apparatus of claim 1, wherein the plurality of first magnetic field sensing elements is arranged to form a ring around the first contact member.

9. The apparatus of claim 1, further comprising a plurality of second magnetic field sensing elements that is formed over the first layer of dielectric material, the plurality of second magnetic field sensing elements being arranged to at least partially surround the first contact member, the plurality of second magnetic field sensing elements having respective axes of maximum sensitivity that are arranged in a second pattern, the plurality of second magnetic field sensing elements also being part of the sensing circuit.

10. The apparatus of claim 9, wherein the first pattern includes a clockwise pattern and the second pattern includes a counterclockwise pattern.

11. The apparatus of claim 9, wherein the plurality of first magnetic field sensing elements is arranged to form a first ring around the first contact member, and the plurality of second magnetic field sensing elements is arranged to form a second ring around the first contact member.

12. The apparatus of claim 1, wherein the first contact member is electrically coupled to the gate layer of the switching device, and the sensing circuit is configured to measure the level of electrical current flowing between the gate layer and at least one of the source layer and the drain layer of the switching device.

13. The apparatus of claim 1, wherein the first contact member is electrically coupled to the source layer of the switching device, and the sensing circuit is configured to measure the level of electrical current flowing between the source layer and the drain layer of the switching device.

14. The apparatus of claim 1, wherein the first contact member is electrically coupled to the drain layer of the switching device, and the sensing circuit is configured to measure the level of electrical current flowing between the source layer and the drain layer of the switching device.

15. The apparatus of claim 1, further comprising:

a second contact member that is electrically coupled to another one of the source layer, the drain layer, and the gate layer;

a third contact member that is electrically coupled to a remaining one of the source layer, the drain layer, and the gate layer; and a second terminal that is electrically coupled to the second contact member; and a third terminal that is coupled to the third contact member.

16. The apparatus of claim 1, wherein each of the first magnetic field sensing elements includes a tunneling magnetoresistance (TMR) element.

17. The apparatus of claim 1, wherein any of the first magnetic field sensing elements includes one of a vertical Hall element, giant magnetoresistance (GMR) element, a tunneling magnetoresistance (TMR) element, or a magnetic tunnel junction (MTJ).

18. A current sensor, comprising:

a substrate;

a metal layer that is formed over the substrate;

a first layer of dielectric material that is formed over the metal layer;

a first contact member that is coupled to the metal layer, the first contact member extending through the first layer of dielectric material;

a second contact member that is coupled to the metal layer, the second contact member extending through the first layer of dielectric material;

a plurality of first magnetic field sensing elements that is formed over the first layer of dielectric material, the plurality of first magnetic field sensing elements being arranged to at least partially surround the first contact member, the plurality of first magnetic field sensing elements having respective axes of maximum sensitivity that are arranged in a first pattern, the plurality of first magnetic field sensing elements being arranged, at least in part, to form a sensing circuit for measuring a level of electrical current through the metal layer;

a first terminal that is coupled to the first contact member;

a second terminal that is coupled the second contact member; and a third terminal that is coupled to the sensing circuit, the second terminal being configured to output, at least in part, a signal that is indicative of the level of electrical current through the first contact member.

19. The current sensor of claim 18, wherein the sensing circuit includes a serial circuit.

20. The current sensor of claim 18, wherein the sensing circuit includes a bridge circuit.

21. The current sensor of claim 18, wherein the first pattern includes one of a counterclockwise pattern or clockwise pattern.

22. The current sensor of claim 18, wherein the first pattern includes a pattern in which a respective axis of maximum sensitivity of each of the first magnetic field sensing elements is oriented in a same direction.

23. The current sensor of claim 18, further comprising a plurality of second magnetic field sensing elements that is formed over the first layer of dielectric material, the plurality of second magnetic field sensing elements being arranged to at least partially surround the first contact member, the plurality of second magnetic field sensing elements having respective axes of maximum sensitivity that are arranged in a second pattern, the plurality of second magnetic field sensing elements also being part of the sensing circuit.

24. The current sensor of claim 23, wherein the first pattern includes a clockwise pattern and the second pattern includes a counterclockwise pattern.

25. The current sensor of claim 18, wherein the sensing circuit is coupled to the third terminal via a processing circuitry, the processing circuitry being configured to generate the signal based on another signal that is generated by the sensing circuit, the processing circuitry including at least one of analog or digital circuitry.

26. The current sensor of claim 18, wherein each of the first magnetic field sensing elements includes a tunneling magnetoresistance (TMR) element.

27. The current sensor of claim 18, wherein any of the first magnetic field sensing elements includes one of a vertical Hall element, giant magnetoresistance (GMR) element, a tunneling magnetoresistance (TMR) element, or a magnetic tunnel junction (MTJ).

28. An apparatus, comprising:

a substrate;

a switching device that is formed over the substrate, the switching device including a gate layer, a source layer, and a drain layer, the gate layer, the source layer, and the drain layer being formed over the substrate and adjacent to each other, the source layer including a first base, the drain layer including a second base, the source layer including a plurality of first portions that extend from the first base towards the second base, the drain layer including a plurality of second portions that extend from the second base toward the first base, the plurality of first portions being interleaved with the plurality of second portions;

a plurality of magnetic field sensing elements that is formed over the substrate, each of the magnetic field sensing elements being formed over a different one of a plurality of substrate regions, each of the plurality of substrate regions being situated between a different one of the plurality of first portions and one of the plurality of second portions that is directly adjacent to the first portion, wherein the plurality of magnetic field sensing elements being arranged, at least in part, to form a sensing circuit for measuring a level of electrical current through the switching device.

29. The apparatus of claim 28, wherein the sensing circuit includes a serial circuit.

30. The apparatus of claim 28, wherein the sensing circuit includes a bridge circuit.

31. The apparatus of claim 28, wherein the switching device includes a GaN switching device.

* * * * *